United States Patent
Tailliet

(10) Patent No.: US 9,001,602 B2
(45) Date of Patent: Apr. 7, 2015

(54) METHOD OF BURN-IN TEST OF EEPROM OR FLASH MEMORIES

(75) Inventor: Francois Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 288 days.

(21) Appl. No.: 13/610,443

(22) Filed: Sep. 11, 2012

(65) Prior Publication Data

US 2013/0064015 A1     Mar. 14, 2013

(30) Foreign Application Priority Data

Sep. 12, 2011   (FR) ...................... 11 58095

(51) Int. Cl.
G11C 29/00     (2006.01)
G11C 29/02     (2006.01)
G11C 29/06     (2006.01)

(52) U.S. Cl.
CPC ............. *G11C 29/02* (2013.01); *G11C 29/06* (2013.01)

(58) Field of Classification Search
CPC .................. G11C 29/02; G11C 29/06
USPC ..................... 365/200, 201, 185.18
See application file for complete search history.

(56) References Cited

U.S. PATENT DOCUMENTS

| 5,243,569 A | 9/1993 | Atsumi | |
|---|---|---|---|
| 5,379,260 A * | 1/1995 | McClure | 365/201 |
| 6,661,719 B1 * | 12/2003 | Shih et al. | 365/201 |
| 2002/0024059 A1 * | 2/2002 | Hidaka | 257/189 |
| 2007/0058466 A1 * | 3/2007 | Joshi et al. | 365/201 |
| 2013/0021864 A1 * | 1/2013 | Deng et al. | 365/201 |
| 2013/0039139 A1 * | 2/2013 | Raval et al. | 365/201 |

* cited by examiner

*Primary Examiner* — J. H. Hur
(74) *Attorney, Agent, or Firm* — Seed IP Law Group PLLC

(57) ABSTRACT

A method for testing an integrated circuit includes, in a burn-in test mode, two steps during which gate oxides of conductive high voltage MOS transistors of the integrated circuit are subjected to a first test voltage, and blocked high voltage MOS transistors of the integrated circuit are subjected to a second test voltage. The first test voltage is set to a value higher than a high supply voltage supplied to the high voltage MOS transistors in a normal operating mode, to make the gate oxides of transistors considered as insufficiently robust break down. The second test voltage is set to a value lower than the first test voltage and which can be supported by the blocked transistors, the states of the transistors being changed between the two steps.

20 Claims, 6 Drawing Sheets

METHOD OF BURN-IN TEST OF EEPROM OR FLASH MEMORIES

BACKGROUND

1. Technical Field

The present disclosure relates to burn-in tests of integrated circuits like EEPROM memories, at the end of manufacture. These tests include in particular subjecting, during some time, an integrated circuit to unfavorable operating constraints, to cause a failure of the circuit if it has some manufacture defects. That way, the integrated circuits passing such tests have a failure rate which may reach low values.

2. Description of the Related Art

One of the main causes of failure of an EEPROM memory is gate oxide breakdown of transistors which may be subjected to a relatively high voltage. The rate of failure tends to increase with memory miniaturization. In an EEPROM memory, such high voltage transistors are present in bit line latches, gate control latches and word line selection latches, as well as in each memory cell and in gate control switches of a group of memory cells. FIG. 1 schematically shows a conventional EEPROM memory. In FIG. 1, the memory MEM1 comprises a memory array CELM comprising memory cells distributed into lines and columns transverse to lines. Line and column decoders YDC1, XDC1 allow one or more words comprising several memory cells belonging to a same line to be selected. Decoders XDC1, YDC1 are controlled by an address register AREG allowing a word at the intersection of a line and a group of columns to be selected. The memory array CELM comprises a bit line BL for each column of memory cells, a word line WL for each line of memory cells and a gate control line CGL for each word column, each gathering several bit lines. Decoders XDC1, YDC1 are powered by a voltage VPP, VPE, VPW by a high voltage generation circuit HVG1, and control the memory cells for reading, programming and erasing by supplying voltages adapted to the bit lines BL, the gate control lines CGL for decoder XDC1 and the word lines WL for decoder YDC1. For reading, the voltage VPP is equal to the supply voltage of the memory, and for programming and erasing, the voltage Vpp is equal to a high voltage, around 15 V.

Some memories have a burn-in test mode. To that end, they comprise a mode control circuit TMC1 to place the memory either in burn-in test mode, or a normal operating mode as a function of a test signal TST supplied to the memory. Circuit TMC1 controls circuit HVG1 and decoder YDC1, in particular to adjust the value of high voltage VPP as a function of the operating mode.

FIG. 2 shows a memory cell MC of the memory array CELM. In FIG. 2, each cell MC comprises an access transistor AT and a floating gate transistor FGT connected in series, the drain of transistor AT being connected to a bit line BL, and the source of transistor FGT being connected to the ground. The gate of transistor AT is connected to a word line WL and the gate of a gate control transistor CGT whose drain is connected to a gate control line CGL, and whose source is connected to the gate of transistor FGT. To program and erase the cell MC, transistors AT and CGT must be able to support the high voltage generated by circuit HVG1.

FIGS. 3A, 3B show a bit line latch of decoder XDC1. The bit line latch comprises two inverters mounted back-to-back, each formed by a high voltage P-channel MOS transistor, referred to as P1, P2, and a high voltage N-channel MOS transistor, referred to as N1, N2. Transistors P1, P2 receive voltage VPP on their source and their well bias terminal. The sources of transistors N1, N2 are connected to a low voltage line SWG. The drains of transistors P1, N1 and the gates of transistors P2, N2 are connected to the low voltage line SWG through an N-channel MOS transistor referred to as N3, whose gate is controlled by a reset signal RST. The drains of transistors P1, N1 and the gates of transistors P2, N2 are also connected to the gate of an N-channel MOS transistor referred to as N6, receiving on its drain a write command voltage VPW and whose source is connected to a bit line BL. The gates of transistors P1, N1 and the drains of transistors P2, N2 are connected to the low voltage line SWG through two N-channel MOS transistors referred to as N4, N5 connected in series. The gate of transistor N4 is controlled by a word column selection signal COL and the gate of transistor N5 is controlled by a data signal DT supplying the value of a bit to be written in a selected memory cell MC. Therefore, a bit line BL can be subjected to the high voltage only if the corresponding bit line latch is in the active state, if the data to be programmed DT is at 1, and if the corresponding column is selected (signal COL at 1). In some memories, the sources of transistors N3 and N5 may be connected to the ground GND.

FIG. 3A shows the latch in normal operation, in the reset state during a programming or write cycle. This state is previously reached by the temporary switching of transistor N3 to the conductive state, after a pulse of signal RST, maintaining transistors N4 and N5 in the blocked state (signals COL and DT at 0). During the pulse of signal RST, the drains of transistors P1, N1 and the gates of transistors P2, N2 receive the voltage SWG. Transistors P1 and N2 therefore switch to the blocked state, while transistors P2, N1 switch to the conductive state. The voltage SWG may be chosen different from zero, for example equal to 3 V, so as to limit the drain-well and drain-source voltages of transistors P1, P2 and drain-source voltages of transistors N1, N2. In practice, voltage SWG may not be higher to avoid programming non-addressed memory cells. When voltage VPP is set at the programming value (for example 15 V), transistors P2 and N1 are subjected to a maximum gate oxide stress voltage of 15−3=12 V.

FIG. 3B shows the latch in normal operation, in the active state during a programming or write cycle. This state is previously reached by temporary and simultaneously switching transistors N4 and N5 to the conductive state, after a pulse of signals COL and DT, while maintaining transistor N3 in the blocked state. During the pulse of signals COL and DT, the gates of transistors P1 and N1 and the drains of transistors P2, N2 receive the voltage SWG. Transistors P1 and N2 switch to the conductive state, while transistors P2, N1 switch to the blocked state. When voltage VPP is set to the programming value, transistors P1 and N2 are subjected to a maximum gate oxide stress voltage of 15−3=12 V.

The gate control line latches CGL of decoder XDC1 and the word line latches WL of decoder YDC1 have architectures similar to that of the bit line latch previously described.

To reduce circuit failure rate due to gate oxide breakdown of high voltage transistors, it is known to subject these circuits, at the end of manufacture, to burn-in tests that subject the gate oxides of high voltage transistors to sufficiently high test voltages below the intrinsic breakdown voltage of these gate oxides. The aim of these tests is to prematurely make weak microelectronic structures break down, so as to discard faulty or insufficiently robust circuits, and thus avoid them from being prematurely faulty during their use. A burn-in test is all the more efficient to discard the circuits having manufacture defects as test voltages are much higher than the voltages applied in normal operation, even near the intrinsic breakdown voltage of the gate oxides of high voltage transistors. However, the test voltages should not be chosen too close to this intrinsic breakdown voltage to avoid discarding circuits having acceptable defects.

FIGS. 4A, 4B show the bit line latch previously described, respectively in the reset state and the active state, burn-in test voltages being indicated. In burn-in test, voltages VPP and SWG are set to values allowing transistors P1, P2, N1, N2 to be subjected to a maximum gate oxide stress voltage without exceeding a breakdown threshold voltage of transistors P1, P2. In the example of FIGS. 4A, 4B, voltage VPP is set to 14 V and voltage SWG to 0 V. The weakness of P-channel MOS transistors formed in a well, is their drain-well junction which cannot admit more than 14 V in the blocked state. At voltages superior or equal to this value, leaks may also appear between the drain and source of these transistors. It is therefore not possible to subject these transistors to voltages significantly higher than normal operating voltages (VPP−SWG=12 V). However, the weakness of N-channel MOS transistors is between the drain and source, whose voltage cannot exceed 17 V in the blocked state.

When the latch is in the reset state shown by FIG. 4A, transistors P1 and N2 are blocked, while transistors P2 and N1 are conductive. The transistors whose gate oxides are subjected to a voltage stress of 14 V are therefore the conductive transistors P2, N1 (surrounded by a dotted line).

When the latch is in the active state shown by FIG. 4B, transistors P1 and N2 are conductive, while transistors P2, N1 are blocked. The transistors whose gate oxides are subjected to a voltage stress of 14 V are therefore the conductive transistors P1, N2 (surrounded by a dotted line). Transistor N6 which is subjected to voltage VPP, is also conductive. If the voltage VPW is equal to 0, this transistor is also subjected to a gate oxide stress voltage at 14 V.

Although the gate oxides of transistors considered to be of sufficient quality may support 17 V, it is not possible to go beyond 14 V due to the presence of P-channel transistors in the blocked state whatever the state of the circuit.

To compensate for the small difference between test voltages and normal operation voltages, it is known to increase the time during which each transistor to be tested is subjected to a test voltage. This solution also has a limit since it cannot be considered to penalize production rates by increasing burn-in test durations beyond an acceptable limit.

BRIEF SUMMARY

One embodiment of the present disclosure reduces the premature failure rate of integrated circuits comprising MOS transistors subjected to high voltages, without increasing burn-in test durations. One embodiment of the present disclosure increase the burn-in test voltage for all the high voltage transistors of such integrated circuits, while maintaining this voltage below the breakdown voltage of the gate oxides of these transistors.

Embodiments relate to a method for testing an integrated circuit, the method comprising in a burn-in test mode, two steps during which gate oxides of high voltage MOS transistors in the conductive state of the integrated circuit are subjected to a first test voltage, and high voltage MOS transistors in the blocked state of the integrated circuit are subjected to a second test voltage, the first test voltage being set to a value higher than a high supply voltage supplied to the high voltage MOS transistors of the integrated circuit in a normal operating mode, to make the gate oxides of high voltage transistors considered as insufficiently robust break down, the second test voltage being set to a value lower than the first test voltage, which can be supported by the high voltage transistors in the blocked state, and sufficient to ensure a normal operation of the circuit, the states of the high voltage transistors being changed between the two steps.

According to an embodiment, the first test voltage is subjected by supplying a first voltage to source terminals of high voltage P-channel MOS transistors in the conductive state, and the second test voltage is subjected by supplying a second voltage to source terminals of high voltage P-channel MOS transistors in the blocked state, a same high voltage being supplied in normal operation to the source terminals of the high voltage P-channel MOS transistors in the conductive or blocked state.

According to an embodiment, the first test voltage is subjected by supplying a third voltage to source terminals of high voltage N-channel MOS transistors in the conductive state, and the second test voltage is subjected by supplying a fourth voltage higher than the third test voltage, to source terminals of high voltage N-channel MOS transistors in the blocked state, a same high voltage being supplied in normal operation to the source terminals of the high voltage N-channel MOS transistors in the conductive or blocked state.

According to an embodiment, the integrated circuit is a non-volatile memory comprising bit line latches, gate control latches, word line latches, and a memory array comprising memory cells, each of the latches and the memory array comprising high voltage transistors which are subjected to the first and second test voltages in burn-in test mode, all the latches being in a reset state during the first step of the burn-in test, and in an active state during the second step of the burn-in test, the high voltage transistors of the memory array being in the conductive state during the second step of the burn-in test and subjected to the first test voltage.

According to an embodiment, each of the first and second steps of the burn-in test mode has a duration corresponding to several standard erase and write cycles of the memory in normal operation.

According to an embodiment, write and erase control signals are forced to zero during the second step of burn-in test, these signals being at the high voltage respectively during write and erase operations of the memory in normal operation.

Embodiments also relate to an integrated circuit comprising MOS transistors configured to support a high voltage higher than a supply voltage of the integrated circuit, the integrated circuit being configured to operated either in a test mode, or in a normal mode, configured to implement the method as above-defined.

According to an embodiment, the integrated circuit comprises a generation circuit for generating a high voltage from a supply voltage of the integrated circuit, a control circuit for controlling the generation circuit so that it generates in the burn-in test mode a first high voltage higher than a high voltage generated in the normal operating mode, and a switching circuit controlled by the control circuit to generate from the high voltage supplied by the generation circuit, a second high voltage lower than the first high voltage, and transmit them to the source terminals of high voltage P-channel MOS transistors as a function of the conductive or blocked state of the P-channel MOS transistors.

According to an embodiment, the integrated circuit comprises two high voltage supply lines, each connected by source terminals to the high voltage P-channel MOS transistors in a same conductive or blocked state at a given time.

According to an embodiment, the integrated circuit comprises two low voltage supply lines, connected by source terminals to the high voltage N-channel MOS transistors in a same conductive or blocked state at a given time.

According to an embodiment, the integrated circuit comprises a memory comprising bit line latches, gate control latches and word line latches and a memory array, the latches and the memory array comprising high voltage MOS transistors to be tested during the burn-in test.

According to an embodiment, each latch comprises two high voltage supply lines, each connected by source terminals to the high voltage P-channel MOS transistors in a same conductive or blocked state at a given time.

According to an embodiment, each latch comprises two low voltage supply lines connected by source terminals to the high voltage N-channel MOS transistors in a same conductive or blocked state at a given time.

According to an embodiment, selection circuits for selecting memory cells are configured to reset all the memory cell selection latches during the first burn-in test step, and to select all the cells of the memory during the second burn-in test step.

BRIEF DESCRIPTION OF THE SEVERAL
VIEWS OF THE DRAWINGS

Embodiments of the disclosure will be described hereinafter, in relation with, but not limited to the appended figures wherein:

FIG. 1 previously described schematically shows a conventional EEPROM memory;

FIG. 2 previously described shows a memory cell of the memory of FIG. 1;

FIGS. 3A, 3B previously described, show a bit line latch of the memory of FIG. 1, in normal operation;

FIGS. 4A, 4B previously described, show the bit line latch, in burn-in test;

FIG. 5 schematically shows an EEPROM memory, according to one embodiment;

Figure 8A:
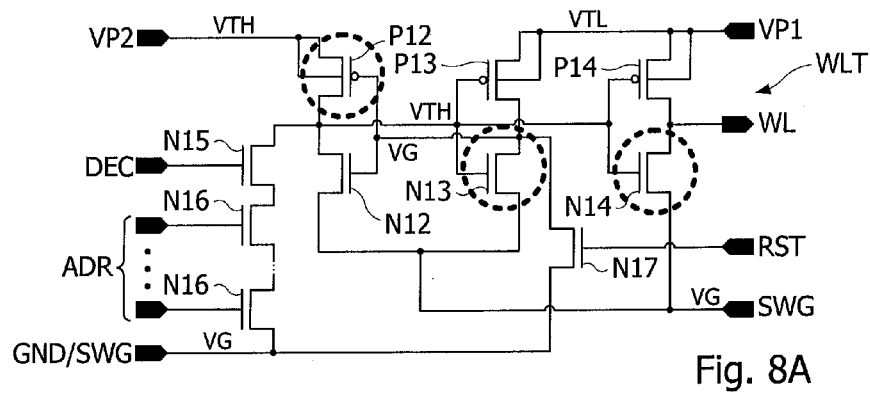
FIGS. 8A, 8B show a word line latch, according to one embodiment.
Figure 8B:
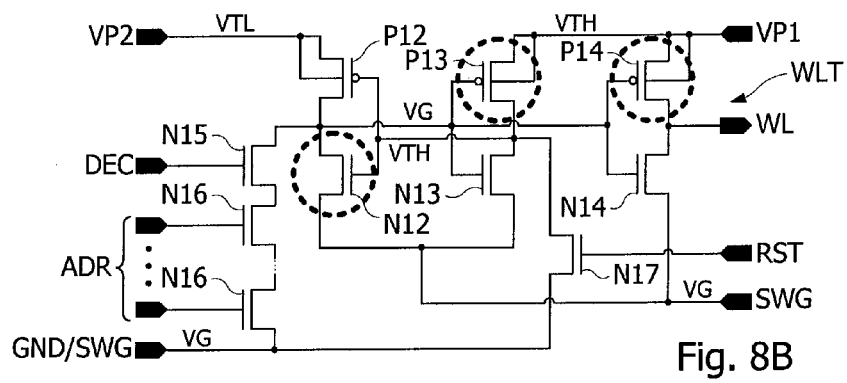
Figure 9:
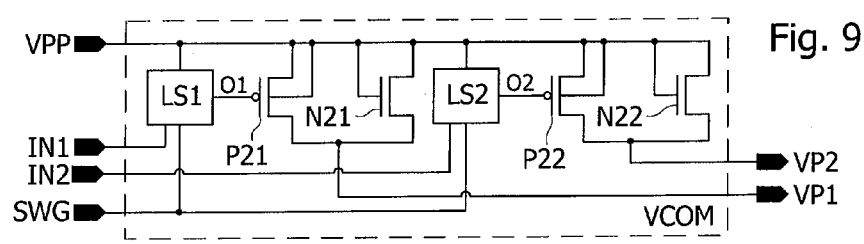
Figure 10A:
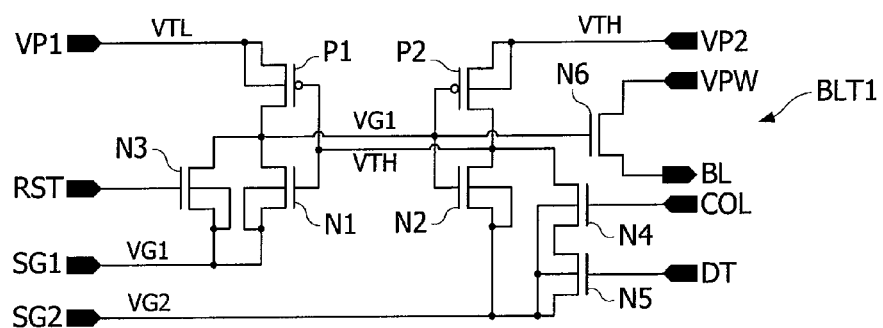
Figure 10B:
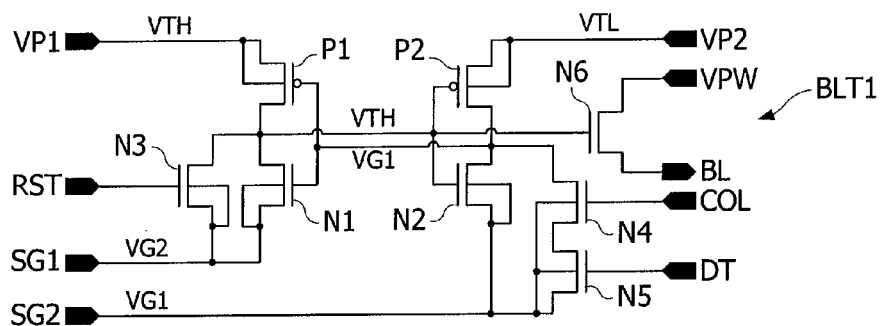

FIG. 9 schematically shows a circuit of the memory of FIG. 8;

FIGS. 10A, 10B schematically show a bit line latch, according to another embodiment.

DETAILED DESCRIPTION

Figure 5:
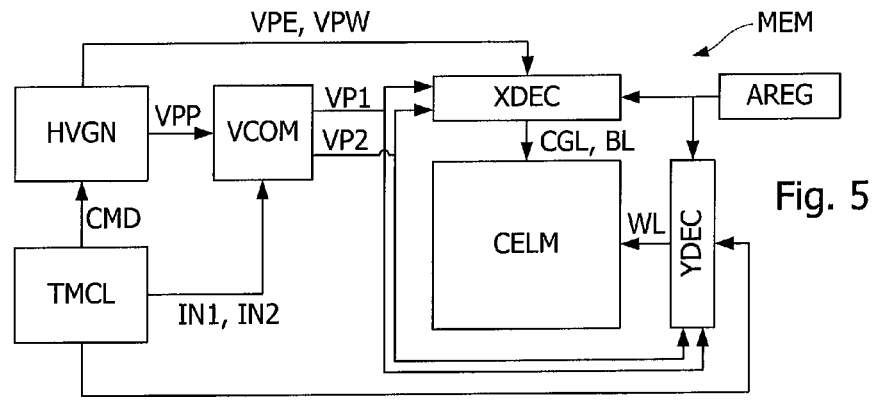

FIG. 5 shows an EEPROM memory referred to as MEM, according to one embodiment. Memory MEM comprises a memory array CELM comprising memory cells distributed into lines and columns transverse to lines. Line YDEC and column XDEC decoders allow one or more words comprising several memory cells of a same line to be selected. Decoders XDEC, YDEC are controlled by an address register AREG allowing a word at the intersection of a line and a group of columns to be selected. A high voltage generation circuit VPGN supplies a high voltage VPP and voltages VPE, VPW to decoder XDEC. Decoders XDEC, YDEC control memory cells for reading, programming or erasing by providing adapted voltages, to bit lines BL, and gate control lines CGL for decoder XDEC, and word lines WL for decoder YDEC. A mode control circuit TMCL transmits a control signal CMD to the circuit HVGN to activate a burn-in test mode or a normal operating mode of the memory.

Figure 1:
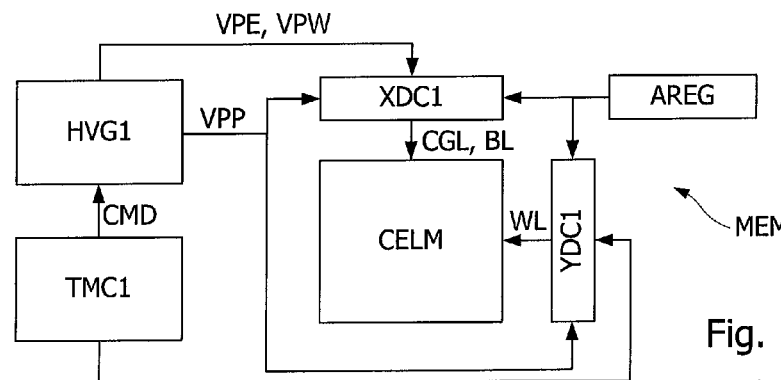
Figure 2:
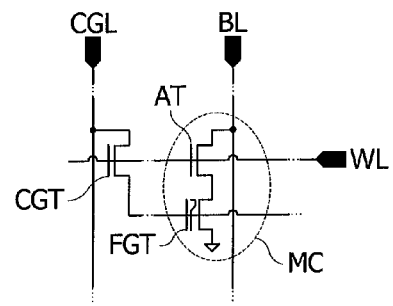
Figure 3A:
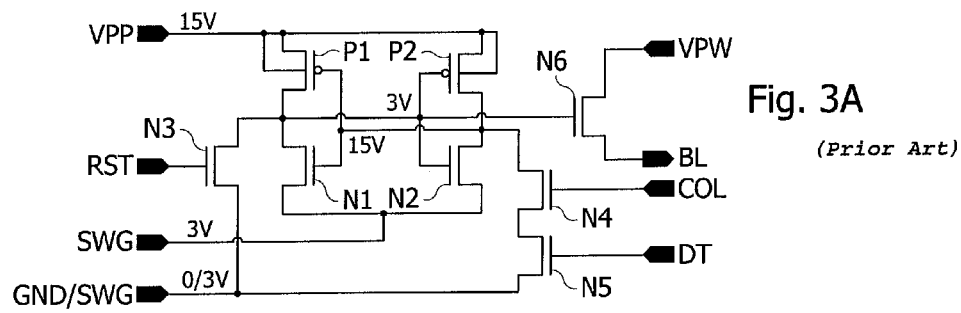
Figure 3B:
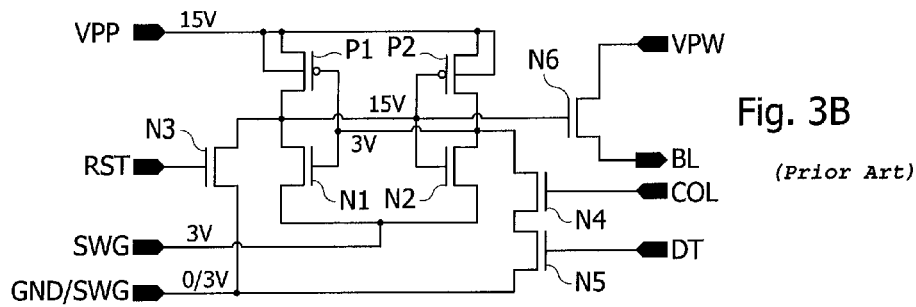

According to one embodiment, the memory MEM is modified with respect to that shown in FIG. 1, to generate different high voltages VP1 and VP2. To that end, a switching circuit VCOM supplies, to decoders XDEC, YDEC, high voltages VP1, VP2 which may differ from voltage VPP supplied by generator HVGN. The circuit TMCL transmits control signals IN1, IN2 to circuit VCOM allowing it to determine the values of voltages VP1 and VP2 to be supplied to decoders XDEC, YDEC. In a burn-in test mode, the high voltage P-channel transistors of the circuits of memory MEM receive one or the other of high voltages VP1, VP2 whether they are conductive or blocked.

Figure 6A:
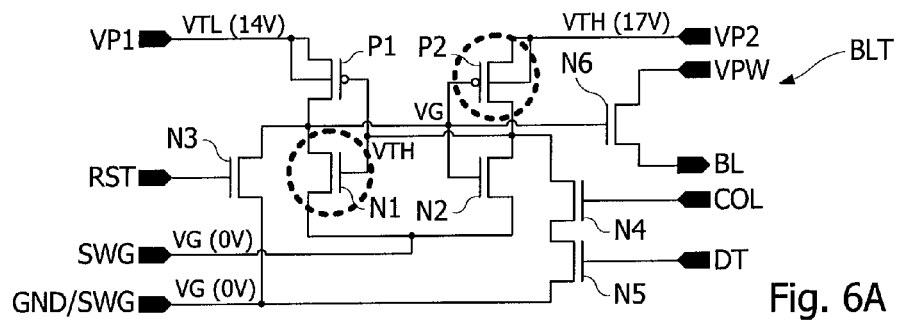
FIGS. 6A, 6B show a bit line latch, according to one embodiment.
Figure 6B:
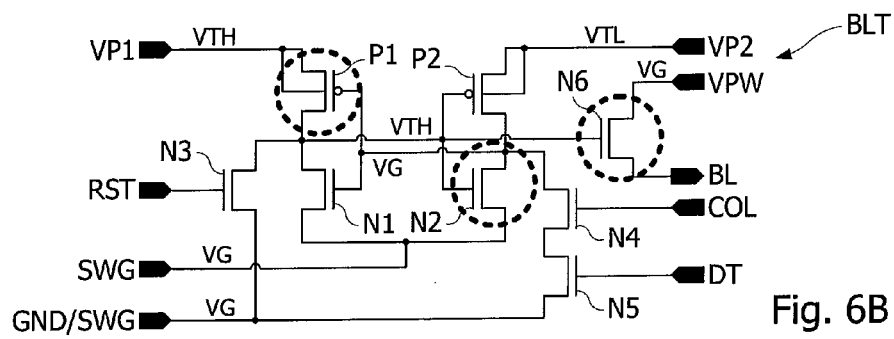

FIGS. 6A, 6B show a bit line latch BLT of decoder XDEC, according to one embodiment. The bit line latch comprises two inverters mounted back-to-back, each formed by a high voltage P-channel MOS transistor, referred to as P1, P2, and a high voltage N-channel MOS transistor, referred to as N1, N2. Transistor P1 comprises a source and a well bias terminal receiving voltage VP 1. Transistor P2 comprises a source and a well bias terminal receiving voltage VP2. The sources of transistors N1, N2 are connected to a low voltage line SWG. The drains of transistors P1, N1 and the gates of transistors P2, N2 are connected to the low voltage line SWG or the ground GND through an N-channel MOS transistor referred to as N3, whose gate is controlled by a reset signal RST. The drains of transistors P1, N1 and the gates of transistors P2, N2 are also connected to the gate of a high voltage N-channel MOS transistor referred to as N6. Transistor N6 comprises a drain receiving a write command voltage VPW and a source connected to a bit line BL of the memory array. The gates of transistors P1, N1 and the drains of transistors P2, N2 are connected to the low voltage line SWG or the ground GND through two N-channel MOS transistors referred to as N4, N5, connected in series. The gate of transistor N4 is controlled by a word column selection signal COL and the gate of transistor N5 is controlled by a data signal DT supplying the value of a bit to be written in a selected memory cell.

FIGS. 6A, 6B show two steps of the burn-in test of the bit line latch. In burn-in test, each voltage VP1 and VP2 is set to a maximum value that the blocked transistors receiving the voltage can support. In FIG. 6A, the latch is in the reset state. This state is previously reached by the temporary switching of transistor N3 to the conductive state, after a pulse of signal RST, maintaining transistors N4 and N5 in the blocked state (signals COL and DT at 0). Transistors P2 and N1 are in the conductive state, while transistors P1, N2 and N6 are in the blocked state. Voltage VP1 is set to a value VTL which can be supported by transistors P1, P2 in the blocked state, and voltage VP2 is set to a maximum value VTH which can be supported by transistors N1, N2, N3 in the blocked state. Voltage VTH may also correspond to a value lower than the average gate oxide breakdown voltage of the transistors in the conductive state of memory MEM. Voltage VTH may also correspond to a voltage that the gate oxides of the high voltage transistors in the conductive state must support to be considered as acceptable. Voltage SWG is set to a voltage VG corresponding to the circuit ground or a voltage near the ground. Tested transistors N1, P2 (surrounded by a dotted line) are subjected to a gate oxide stress voltage equal to VP2−SWG=VTH−VG.

In FIG. 6B, the latch is in the active state. This state is previously reached by the temporary and simultaneous switching of transistors N4 and N5 to the conductive state, after a pulse of signals COL and DT, maintaining transistor N3 in the blocked state (signal RST at 0). Transistors P1, N2 and N6 are in the conductive state, while transistors P2, N1 are in the blocked state. Voltage VP1 is set to the voltage VTH, voltage VP2 is set to the voltage VTL. Tested transistors P1, N2 (surrounded by a dotted line) are subjected to a gate oxide stress voltage equal to VP1−SWG=VTH−VG. It is the same for transistor N6 if signal VPW is set to the voltage VG.

Figure 4A:
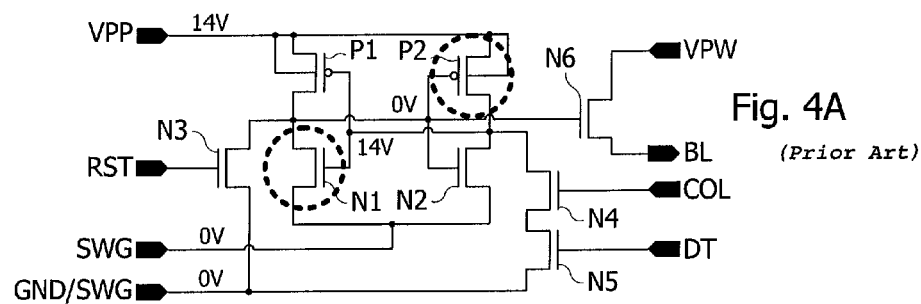
Figure 4B:
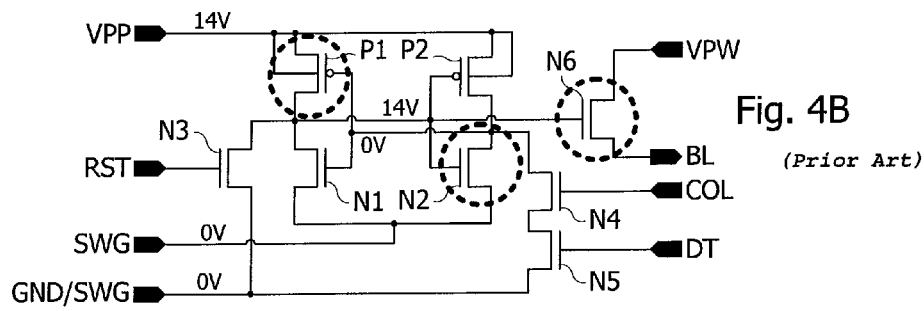

In normal operation, voltages VP1 and VP2 (VTL and VTH) are for example equal to 15 V and voltage VG is for example set to 3 V during a programming or write cycle. In burn-in test, voltages VTL and VTH may be chosen equal to respectively 14 V and 17 V, and voltage VG may be set to 0, given an average gate oxide breakdown voltage of the high voltage transistors around 20 V. In this example, each high voltage transistor P1, P2, N1, N2, N6 of the circuit of FIGS. 6A, 6B may therefore be tested at a gate oxide stress voltage equal to VTH−VG=17 V, which represents a gain of 3 V with respect to the circuit of FIGS. 4A, 4B. The result is also that the gate oxide of each transistor P1, P2, N1, N2, N6 may be tested at a same value VTH-VG chosen as a function of a desired robustness level, to discard the circuits considered as insufficiently robust.

Figure 7A:
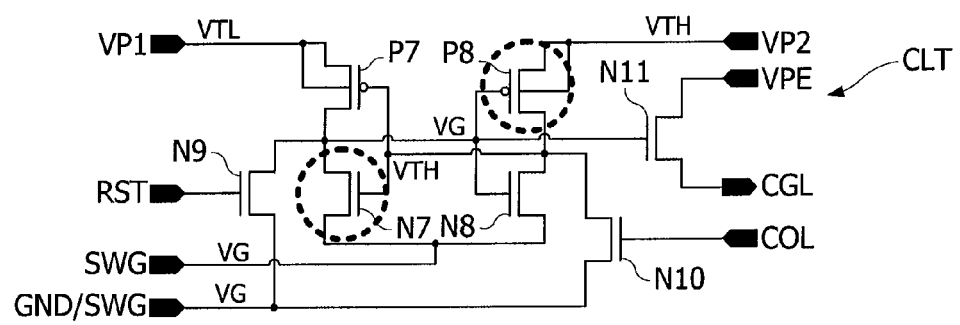
FIGS. 7A, 7B show a gate control line latch, according to one embodiment.
Figure 7B:
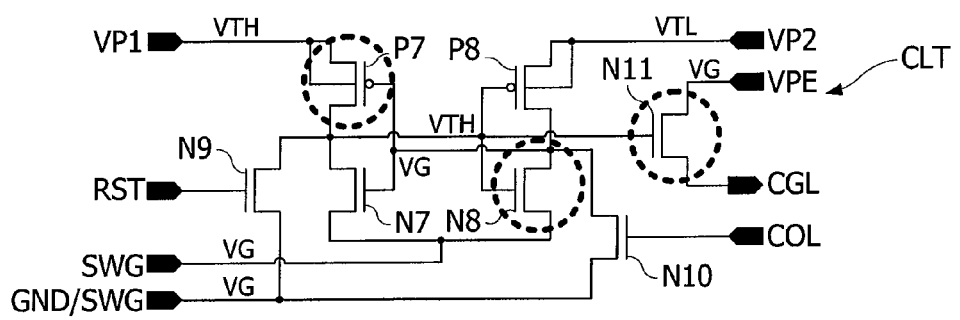

Such a result may also be obtained for gate control latches and word line latches of the memory MEM. Thus, FIGS. 7A, 7B show a gate control line latch CLT of decoder XDEC, according to one embodiment. The gate control line latch comprises two inverters mounted back-to-back, each formed by a high voltage P-channel MOS transistor, referred to as P7, P8, and a high voltage N-channel MOS transistor, referred to as N7, N8. Transistor P7 comprises a source and a well bias terminal receiving voltage VP1. Transistor P8 comprises a source and a well bias terminal receiving the high voltage VP2. The sources of transistors N7, N8 are connected to the low voltage line SWG. The drains of transistors P7, N7 and the gates of transistors P8, N8 are connected to the low voltage line SWG or the ground GND through an N-channel MOS transistor referred to as N9, whose gate is controlled by a reset signal RST. The drains of transistors P7, N7 and the gates of transistors P8, N8 are also connected to the gate of a high voltage N-channel MOS transistor referred to as N11, receiving on its drain an erase command voltage VPE and whose source is connected to a gate control line CGL of the memory array. The gates of transistors P7, N7 and the drains of transistors P8, N8 are connected to the low voltage line SWG or the ground GND through an N-channel MOS transistor referred to as N10. The gate of transistor N10 is controlled by the word column selection signal COL.

FIGS. 7A, 7B show two steps of the burn-in test of the gate control latch. In burn-in test, each voltage VP1 and VP2 is set to a maximum value that the blocked transistors receiving the voltage can support. In FIG. 7A, the latch is in the reset state. This state is previously reached by the temporary switching of transistor N9 to the conductive state, after a pulse of signal RST, maintaining transistor N10 in the blocked state (signal COL at 0). Transistors P8 and N7 are in the conductive state, while transistors P7, N8 and N11 are in the blocked state. Voltage VP1 is set to the voltage VTL that transistor P7 in the blocked state can support, voltage VP2 is set to the voltage VTH, and voltage SWG is set to the voltage VG. Tested transistors N7, P8 (surrounded by a dotted line) are subjected to a gate oxide stress voltage equal to VP2−SWG=VTH−VG (i.e., 17 V in the previous example).

In FIG. 7B, the latch is in the active state. This state is previously reached by the temporary switching of transistor N10 to the conductive state, after a pulse of signal COL, maintaining transistor N9 in the blocked state (signal RST at 0). Transistors P7, N8 and N11 are conductive. Voltage VP1 is set to the voltage VTH, voltage VP2 is set to the voltage VTL, and voltage SWG is set to the voltage VG. Tested transistors P7, N8 (surrounded by a dotted line) are subjected to a gate oxide stress voltage equal to VP1−SWG=VTH−VG (i.e., 17 V in the previous example). It is the same for transistor N11 if voltage VPE is set to VG. The result is that the gate oxide of each transistor P7, P8, N7, N8, N11 may also be tested at voltage VTH-VG.

FIGS. 8A, 8B show a word line latch WLT of decoder YDEC, according to one embodiment. The word line latch comprises three inverters, two of which are mounted back-to-back, each inverter being formed by a high voltage P-channel MOS transistor, referred to as P12, P13, P14 and a high voltage N-channel MOS transistor, referred to as N12, N13, N14. Transistor P12 comprises a source and a well bias terminal receiving voltage VP2. Each transistor P13, P14 comprises a source and a well bias terminal receiving voltage VP1. The sources of transistors N12, N13, N14 are connected to the low voltage line SWG. The drains of transistors P12, N12 and the gates of transistors P13, N13, P14, N14 are connected to the low voltage line SWG or the ground GND through an N-channel MOS transistor referred to as N15, in series with several N-channel MOS transistors referred to as N16 also connected in series. The gate of transistor N15 is controlled by a decoding signal DEC, and the gates of transistors N16 receive the bits of an address word ADR. The drains of transistors P14, N14 are connected to a word line WL. The gates of transistors P12, N12 and the drains of transistors P13, N13 are connected to the low voltage line SWG or the ground GND through an N-channel MOS transistor referred to as N17. The gate of transistor N17 is controlled by the latch reset signal RST.

FIGS. 8A, 8B show two steps of the burn-in test of the word line latch. In burn-in test, each voltage VP1 and VP2 is set to a maximum value that the blocked transistors receiving the voltage can support. In FIG. 8A, the latch is in the reset state. This state is previously reached by the temporary switching of transistor N17 to the conductive state, after a pulse of signal RST, maintaining at least one of transistors N15, N16 in the blocked state (signals DEC or ADR at 0). Transistors P12, N13 and N14 are in the conductive state, while transistors N12, P13 and P14 are in the blocked state. Voltage VP2 is set to the voltage VTH, that transistor N12 in the blocked state can support, and voltage VP1 is set to the voltage VTL, that transistors P13, P14 in the blocked state can support. Voltage SWG is set to the voltage VG. Tested transistors P12, N13, N14 (surrounded by a dotted line) are subjected to a gate oxide stress voltage equal to VP2−SWG=VTH−VG, i.e., 17 V in the previous example.

In FIG. 8B, the latch is in the active state. This state is previously reached by the temporary and simultaneous switching of all transistors N15 and N16 to the conductive state, after a pulse of signals DEC and ADR, maintaining transistor N17 in the blocked state (signal RST at 0). Transistors N12, P13 and P14 are in the conductive state, while transistors P12, N13 and N14 are in the blocked state. Voltage VP2 is set to the voltage VTL, that transistor P12 in the blocked state can support, voltage VP1 is set to the voltage VTH, that transistors N13, N14 and N17 in the blocked state can support. Tested transistors N12, P13, P14 (surrounded by a dotted line) are subjected to a gate oxide stress voltage equal to VP1−SWG=VTH−VG, i.e., 17 V in the previous example. The result is that each transistor P12-P14, N12-N14 may be tested at a same desired value of gate oxide stress voltage.

For the case of FIG. 8B (when the latch is active), a logic circuit may be provided to force all transistors N16 to the conductive state in test mode. Alternately, an additional transistor (not shown) may be provided in parallel of transistors N16, this transistor being controlled in the conductive state when the latch is active in test mode.

FIG. 9 shows an example embodiment of the circuit VCOM. Circuit VCOM comprises two level shifters LS1, LS2 respectively controlled by signals IN1, IN2, two P-channel MOS transistors referred to as P21, P22 and two N-channel MOS transistors referred to as N21, N22. Circuits LS1, LS2 are powered between voltages VPP and SWG. The output of circuit LS1 is connected to the gate of transistor P21 whose source and well receive voltage VPP. The output of circuit LS2 is connected to the gate of transistor P22 whose source and well receive voltage VPP. Transistors N21 and N22 are in diode configuration and receive the voltage VPP on their gates and their drains. The drain of transistor P21 and the source of transistor N21 supply voltage VP1. The drain of transistor P22 and the source of transistor N22 supply voltage VP2.

Various operating modes of circuit VCOM are shown in the following Table 1:

TABLE 1

| Mode | IN1 | IN2 | O1 | O2 | VP1 | VP2 |
|---|---|---|---|---|---|---|
| Normal | 0 | 0 | SWG | SWG | VPP | VPP |
| Test 1 | 1 | 0 | VPP | SWG | VPP–VtN | VPP |
| Test 2 | 0 | 1 | SWG | VPP | VPP | VPP–VtN |

In Table 1, VtN represents the threshold voltage of transistors N21, N22, which is for example equal to 3 V. Voltage VPP corresponds to voltage VTH and voltage VPP–VtN corresponds to voltage VTL.

In normal operating mode and during the programming or write cycles, voltage VPP supplied by circuit HVGN is for example equal to 15 V and voltage SWG is for example equal to 3 V. Outside the programming and erase cycles, the voltage VPP is set to the supply voltage of the circuit and the voltage SWG is set to 0 V. In burn-in test mode, during tests 1 and 2, voltages VPP and SWG are for example set to 17 V and 0 V. In this example, the values of Table 1 are summed up in the following Table 2:

TABLE 2

| Mode | IN1 | IN2 | O1 | O2 | VP1 | VP2 |
|---|---|---|---|---|---|---|
| Normal | 0 | 0 | 3 | 3 | 15 | 15 |
| Test 1 | 1 | 0 | 17 | 0 | 14 | 17 |
| Test 2 | 0 | 1 | 3 | 17 | 17 | 14 |

According to one embodiment, all the bit line, gate control and word line latches are in the reset state during Test 1. The result is that transistors N1, P2 (FIG. 6A), N7, P8 (FIG. 7A), P12, N13 and N14 (FIG. 8A) of the latches of decoders XDEC, YDEC are subjected to a gate oxide stress voltage equal to VP2–SWG=VTH–VG.

In Test 2, all these latches are in the active state. During this test, the data to be written is set to FF (all the signals DT supplied to the bit line latches are at 1), and all the signals COL supplied to the bit line and gate control latches are at 1. Transistors N16 of the word line latches are forced in the conductive state (signals AD forced at 1) or the transistor provided in parallel of transistors N16 of each word line latch is controlled in the conductive state. Voltages VPE and VPW are also set to 0. The result is that transistors P1, N2, N6 (FIG. 6B), P7, N8, N11 (FIG. 7B), N12, P13 and P14 (FIG. 8B) are subjected to a gate oxide stress voltage equal to VP1–SWG=VTH–VG. It is the same for all the transistors AT and CGT of the memory array CELM which are conductive in these conditions. It is to be noted that contrary to memory cell programming in normal operation, signal VPW is set to 0 in Test 2 to subject transistors AT to the gate oxide stress voltage.

The memory cells of the memory array CELM therefore do not switch to the programmed state.

All the high voltage transistors of an EEPROM memory may thus be tested at a same desired gate oxide stress voltage value.

The duration of tests 1 and 2 may be set to the duration of several standard erase or write cycles (in normal operation), for example to some hundreds of milliseconds. To that end, in addition to the conventional timer of an EEPROM memory, an additional timer controlling the duration of tests 1 and 2 may be provided.

In some circuits, N-channel MOS transistors in the blocked state may not support the high voltage VP1 or VP2 applied in test mode to the P-channel MOS transistors in the conductive state. In this case, the source and well bias terminal of N-channel MOS transistors intended to support a high voltage may receive a different voltage whether the transistor is conductive or blocked. To that end, the wells in which the N-channel MOS transistors concerned are formed may be insulated from the substrate in which the circuit is formed, for example by the triple well technique. FIGS. 10A, 10B show a bit line latch circuit modified to that end. In FIGS. 10A, 10B, the bit line latch BLT1 differs from that shown in FIGS. 6A, 6B in that the sources and well bias terminals of transistors N1, N3 receive a voltage SG1, and in that the sources and well bias terminals of transistors N2, N4, N5 receive a voltage SG2 which may differ from voltage SG1. In normal operation, voltages SG1 and SG2 are identical. In test mode, voltages SG1 and SG2 are respectively equal to voltages VG1 and VG2 during test 1, and to voltages VG2 and VG1 during test 2. Transistors P1, P2 are subjected to the same voltages as in FIGS. 6A, 6B.

During test 1 (FIG. 10A), transistors N2 and N4 which are in the blocked state, are subjected to a voltage equal to VP2–SG2=VTH–VG2, while the gate oxide of transistor N1 in the conductive state, is subjected to a voltage equal to VP2–SG1=VTH–VG1. During test 2 (FIG. 10B), transistors N1 and N3 which are in the blocked state, are subjected to a voltage equal to VP1–SG1=VTH–VG2, while the gate oxide of transistor N2 in the conductive state, is subjected to a voltage equal to VP1–SG2=VTH–VG1.

In the previous example, voltages VG1 and VG2 may be chosen respectively equal to 0 and 3 V. The result is that the N-channel MOS transistors in the blocked state are subjected to a voltage of VTH–VG2=14 V, while the gate oxides of the N-channel MOS transistors in the conductive state are subjected to a voltage of VTH–VG1=17 V. Although in this example voltage VTL is equal to VTH–VG2, this condition is not necessary and depends on the structure of the N- and P-channel MOS transistors to be tested.

The gate control latches CLT and the word line latches WLT may be modified similarly to be able to subject the source of the N-channel MOS transistors configured to be subjected to a high voltage in test mode, to voltages VG1, VG2 whether they are conductive or blocked.

Admittedly, if in circuit BLT1, the P-channel MOS transistors in the blocked state may support the high voltage VTH applied in test mode to the P-channel MOS transistors in the conductive state, it is not necessary to provide two different high voltages VP1, VP2 in burn-in test mode.

It will be clear to those skilled in the art that the present disclosure is susceptible of various embodiments and applications. In particular, the disclosure does not only apply to EEPROM memories, but also to Flash memories, and more generally to any other integrated circuit comprising MOS transistors intended to be subjected to voltages higher than the supply voltage supplied to the integrated circuit. Thus, circuits HVGN, TMCL and VCOM may be implemented in any other integrated circuit using a high voltage higher than the supply voltage of the integrated circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   testing an integrated circuit that includes first, second, third, and fourth high voltage MOS transistors, the testing including:
   a first burn-in test that includes subjecting, to a first test voltage, gate oxides of the first and second high voltage MOS transistors in a conductive state, and subjecting, to a second test voltage, the third and fourth high voltage MOS transistors in a blocked state, the first test voltage being set to a value higher than a high supply voltage to be supplied to the high voltage MOS transistors in a normal operating mode, the second test voltage being set to a value lower than the first test voltage and sufficient to ensure a normal operation of the circuit;
   changing the states of the high voltage transistors; and
   a second burn-in test that includes subjecting, to the first test voltage, gate oxides of the third and fourth high voltage MOS transistors in the conductive state, and subjecting, to the second test voltage, the first and second high voltage MOS transistors in the blocked state.

2. The method of claim 1, wherein:
   the first and third high voltage MOS transistors are high voltage P-channel MOS transistors;
   subjecting the gate oxide of the first high voltage MOS transistor in the conductive state to the first test voltage during the first burn-in test includes supplying a first voltage to a source terminal of the first high voltage MOS transistor, and
   subjecting the third high voltage MOS transistor in the blocked state to the second test voltage during the first burn-in test includes supplying a second voltage to a source terminal of the third high voltage MOS transistor, the second voltage being lower than the first voltage, the method further comprising:
   the normal operating mode which includes supplying a same high voltage to the source terminals of the first and third high voltage MOS transistors in the conductive or blocked state.

3. The method of claim 1, wherein:
   the second and fourth high voltage MOS transistors are high voltage N-channel MOS transistors;
   subjecting the gate oxide of the second high voltage MOS transistor in the conductive state to the first test voltage during the first burn-in test includes supplying a first voltage to a source terminal of the second high voltage MOS transistor, and
   subjecting the fourth high voltage MOS transistor in the blocked state to the second test voltage during the first burn-in test includes supplying a second voltage, higher than the first voltage, to a source terminal of the fourth high voltage MOS transistor, the method further comprising:
   the normal operating mode which includes supplying a same voltage to the source terminals of the second and fourth high voltage MOS transistors in the conductive or blocked state.

4. The method of claim 1, wherein:
   the integrated circuit is a non-volatile memory that includes bit line latches, gate control latches, word line latches, and a memory array of memory cells, each of the latches and the memory array including high voltage transistors;
   the first burn-in test includes subjecting first and second high voltage MOS transistors of the latches to the first test voltage and subjecting third and fourth high voltage MOS transistors of the latches to the second test voltage;
   all the latches are in a reset state during the first burn-in test, and are in an active state during the second burn-in test; and
   the second burn-in test includes subjecting the third and fourth high voltage MOS transistors of the latches to the first test voltage, subjecting the first and second high voltage MOS transistors of the latches to the second test voltage, and subjecting the high voltage transistors of the memory array, which are in the conductive state, to the first test voltage.

5. The method of claim 4, wherein each of the first and second burn-in tests has a duration corresponding to several standard erase and write cycles of the memory in the normal operating mode.

6. The method of claim 4, wherein the second burn-in test includes forcing to zero write and erase control signals of the memory, the method further comprising the normal operating mode which includes providing the write and erase control signals at the high supply voltage respectively during write and erase operations of the memory.

7. An integrated circuit, comprising:
   first, second, third, and fourth high voltage MOS transistors electrically coupled to each other; and
   a test circuit configured to test the high voltage MOS transistors by:
   performing a first burn-in test that includes subjecting, to a first test voltage, gate oxides of the first and second high voltage MOS transistors in a conductive state, and subjecting, to a second test voltage, the third and fourth high voltage MOS transistors in a blocked state, the first test voltage being set to a value higher than a high supply voltage to be supplied to the high voltage MOS transistors in a normal operating mode, the second test voltage being set to a value lower than the first test voltage and sufficient to ensure a normal operation of the circuit;
   changing the states of the high voltage transistors; and
   performing a second burn-in test that includes subjecting, to the first test voltage, gate oxides of the third and fourth high voltage MOS transistors in the conductive state, and subjecting, to the second test voltage, the first and second high voltage MOS transistors in the blocked state.

8. The integrated circuit of claim 7, wherein the first and third high voltage MOS transistors are high voltage P-channel MOS transistors and the test circuit includes:
   a generation circuit configured to generate the high supply voltage at a first value for the normal operation and at a second value, higher than the first value, for the first and second burn-in tests;

a switching circuit configured to receive the high supply voltage from the generation circuit, provide a first high voltage based on the high supply voltage, and provide a second high voltage lower than the first high voltage; and a control circuit configured to cause the generating circuit to generate the high supply voltage at the second value and cause the switching circuit to transmit the first and second high voltages to respective source terminals of the high voltage P-channel MOS transistors as a function of the conductive or blocked state of the high voltage P-channel MOS transistors.

9. The integrated circuit of claim 8, wherein the switching circuit has first and second outputs, the integrated circuit further comprising first and second high voltage supply lines, the first high voltage supply line being electrically coupled between the first output of the switching circuit and the source terminal of the first high voltage MOS transistor and the second high voltage supply line being electrically coupled between the second output of the switching circuit and the source terminal of the third high voltage MOS transistor.

10. The integrated circuit of claim 9, wherein the switching circuit is configured to supply a same high voltage at the first and second outputs during the normal operation of the circuit, supply the first output with the first high voltage during the first burn-in test, supply the second output with the second high voltage during the first burn-in test, supply the second output with the first high voltage during the second burn-in test, and supply the first output with the second high voltage during the second burn-in test.

11. The integrated circuit of claim 7, wherein the second and fourth high voltage MOS transistors are high voltage N-channel MOS transistors having respective source terminals, the integrated circuit further comprising first and second low voltage supply lines electrically coupled respectively to the source terminals of the second and fourth high voltage MOS transistors.

12. The integrated circuit of claim 7, comprising a memory including bit line latches, gate control latches word line latches, and a memory array, the latches and the memory array including high voltage MOS transistors configured to be tested during the burn-in tests.

13. The integrated circuit of claim 12, wherein each latch comprises two high voltage supply lines electrically coupled to respective source terminals of high voltage P-channel MOS transistors of the latch.

14. The integrated circuit of claim 13, wherein each latch comprises two low voltage supply lines electrically coupled to respective source terminals of high voltage N-channel MOS transistors of the latch.

15. The integrated circuit of claim 12, further comprising selection circuits configured to select memory cells of the memory array, reset all the latches during the first burn-in test, and select all the memory cells of the memory array during the second burn-in test.

16. An integrated circuit, comprising:
a latch including first and second latch legs, the first latch leg including a first PMOS transistor and a first NMOS transistor electrically coupled between first and second supply terminals and electrically coupled to each other by a first intermediate node, the second latch leg including a second PMOS transistor and a second NMOS transistor electrically coupled between third and fourth supply terminals and electrically coupled to each other by a second intermediate node, the first intermediate node being electrically coupled to respective gates of the second PMOS transistor and the second NMOS transistor, and the second intermediate node being electrically coupled to respective gates of the first PMOS transistor and the first NMOS transistor; and a test circuit configured to supply the first and third supply terminals with first and second test voltages during a burn-in test mode and supply the first and third supply terminals with a same first supply voltage during a normal operating mode, wherein the test circuit includes:
a generation circuit configured to generate a high supply voltage;
a switching circuit configured to receive the high supply voltage from the generation circuit, provide the first and second test voltages based on the high supply voltage, the second test voltage being lower than the first test voltage; and,
a control circuit configured to cause the generating circuit to cause the switching circuit to transmit the first and second test voltages to the respective source terminals of the first and second high voltage P-channel MOS transistors as a function of the conductive or blocked state of the first and second high voltage P-channel MOS transistors.

17. The integrated circuit of claim 16, wherein the test circuit is configured to supply the second and fourth supply terminals with third and fourth test voltages during the burn-in test mode and supply the first and third supply terminals with a same second supply voltage during the normal operating mode.

18. The integrated circuit of claim 16, wherein:
the generation circuit is configured to generate the first supply voltage during the normal operation mode and the first test voltage during the burn-in test mode, the first test voltage being higher than the first supply voltage.

19. The integrated circuit of claim 16, wherein the switching circuit has first and second outputs, the integrated circuit further comprising first and second high voltage supply lines, the first high voltage supply line being electrically coupled between the first output of the switching circuit and the source terminal of the first high voltage MOS transistor and the second high voltage supply line being electrically coupled between the second output of the switching circuit and the source terminal of the third high voltage MOS transistor.

20. The integrated circuit of claim 19, wherein the switching circuit is configured to supply the first supply voltage at the first and second outputs during the normal operation of the circuit, supply the first and second output with the first and second test voltages, respectively, during a first burn-in test of the burn-in test mode, and supply the first and second outputs with the second and first test voltages, respectively, during a second burn-in test of the burn-in test mode.

* * * * *